United States Patent [19]

Takeda

[11] Patent Number: 5,107,584

[45] Date of Patent: Apr. 28, 1992

[54] METHOD OF MANUFACTURING A FLEXIBLE AND WATERPROOF ELECTRIC CIRCUIT

[75] Inventor: Hideaki Takeda, Misato, Japan

[73] Assignee: Danfoss A/S, Nordborg, Denmark

[21] Appl. No.: 594,633

[22] Filed: Oct. 9, 1990

[30] Foreign Application Priority Data

Jan. 29, 1989 [JP] Japan .................................. 1-18188

[51] Int. Cl.⁵ ............................................ H01H 11/00
[52] U.S. Cl. ...................................... 29/622; 29/825; 174/52.3; 174/DIG. 8; 392/383
[58] Field of Search ................ 29/622, 825; 174/52.3, 174/70 S, DIG. 8; 361/332; 392/383, 384, 385, 392

[56] References Cited

U.S. PATENT DOCUMENTS

| | | | |
|---|---|---|---|
| 3,603,720 | 9/1971 | Rabie | 174/52.3 |
| 3,696,329 | 10/1972 | Hazelhurst | 174/70 S |
| 4,105,481 | 8/1978 | Lofdahl | 174/DIG. 8 |
| 4,568,795 | 2/1986 | Wood | 174/52 PE |
| 4,774,383 | 9/1988 | Dalton, Jr. | 174/52.3 |

FOREIGN PATENT DOCUMENTS 0416716 3/1991 European Pat. Off. .

*Primary Examiner*—P. W. Echols
*Attorney, Agent, or Firm*—Wayne B. Easton; Clayton R. Johnson

[57] ABSTRACT

An electric unit with a plurality of electric circuit elements is manufactured to connect terminals of the electric circuit elements directly using flexible conductors and the entire electric unit is covered by a deformable and contractile tube. Entrance and exit of conductors for connecting the electric unit and an external electric circuit are sealed with waterproof synthetic resin in a watertight manner. At least a portion of the electric circuit unit is capable of being bent. The electric unit can be applied to electric appliances having various shapes and further be easily mounted in a space, for example, such as a corner of the electric appliance even if the available space is curved.

3 Claims, 3 Drawing Sheets

METHOD OF MANUFACTURING A FLEXIBLE AND WATERPROOF ELECTRIC CIRCUIT

FIELD OF THE INVENTION AND RELATED ART STATEMENT

The present invention relates to an electric circuit unit having flexibility and waterproof characteristics and to a manufacturing method there for.

An electric appliance such as a hair dryer must incorporate a unit which interrupts the power source immediately when the electric appliance is dropped into the water in order to avoid an electric shock.

A water sensitive power interrupter circuit which detects water entering the circuit to interrupt a power source is disclosed, for example, in Japanese Patent Unexamined Publication No. 1-298817.

FIG. 9 is a circuit diagram of an example of a power interrupter circuit.

Here, a power source (not shown) connected to input terminals I1 and I2 energizes a load connected to output terminals 01 and 02 through contacts 1a and 1b of a solenoid relay 1. A coil of a solenoid relay 1 is connected in series with a contact of a reed relay 2 and connects through the contacts 1a and 1b to the power source. The voltage of the power source appears across a voltage divider composed of a first capacitor C1, a resistor R and a second capacitor C2, and the divided voltage is applied to one terminal of the reed relay 2. The other terminal of the reed relay 2 constitutes a water detecting sensor. When the water detecting sensor and the load are dropped into the water, a weak current flows through the water and consequently the contact of the reed relay 2 is closed. Hence the voltage of the power source is directly applied to the coil of the solenoid relay 1 and the contacts 1a and 1b of the solenoid relay 1 are opened to interrupt the connection between the power source and the load.

FIG. 10 is a modification of the circuit of FIG. 9. A series circuit including first and second capacitors C1 and C2 and a resistor R contains a light emitting diode LED and a diode D. The light emitting diode LED and the diode D are connected to form a reverse parallel circuit. The light emitting diode emits light when a voltage of a power source is applied to the series circuit. Other modifications of the power interrupter circuit are disclosed in the above-mentioned application.

Such power interrupter circuits can detect a weak current flowing through the water to control a large current. Further, since it does not require an amplifier and can be made small, the interrupter can be incorporated into a hair dryer or the like.

Generally, such an electric circuit unit can be realized by mounting circuit elements on a printed circuit board and covering them by water-proof material.

However, the electric appliance to be equipped with the electric circuit unit has various shapes depending on the design thereof and a shape of a space in which the electric circuit unit is mounted is also various. Accordingly, even if the function of the electric circuit unit is the same, it is necessary to provide the electric circuit unit using a printed circuit board different for each model of the electric appliance.

OBJECT AND SUMMARY OF THE INVENTION

It is an object of the present invention to provide an electric circuit unit which can be applied to electric appliances having various shapes and can be easily mounted in a space even if the space is bent, for example, as in a corner of the electric appliance and a manufacturing method thereof.

The above problem is solved by an electric circuit unit including a plurality of electric circuit elements in which connection between terminals of the electric circuit elements is made directly or using flexible conductors and the whole of the electric circuit unit is covered by a deformable and contractile tube with an entrance and exit of conductors for connecting the electric circuit unit and an external electric circuit being sealed by waterproof synthetic resin in the watertight manner and at least a portion of the unit capable of being bent.

The electric circuit elements are connected with each other directly or using flexible conductors without using a printed circuit board. Accordingly, the whole of the electric circuit unit can be bent by deforming the terminals of the electric circuit elements or the conductors slightly. Thus, if a shape of a space in which the electric circuit unit is mounted is, for example, of L-shape, the electric circuit unit can be inserted into the narrow L-shaped space by bending the electric circuit unit into an L-shape when the electric circuit unit is mounted.

Further, since the electric circuit unit is covered by a thermal contractile tube and a waterproof synthetic resin, the electric circuit operates exactly even if the electric appliance is dropped into the water.

DETAILED DESCRIPTION OF PREFERRED EMBODIMENTS

Figure 1:
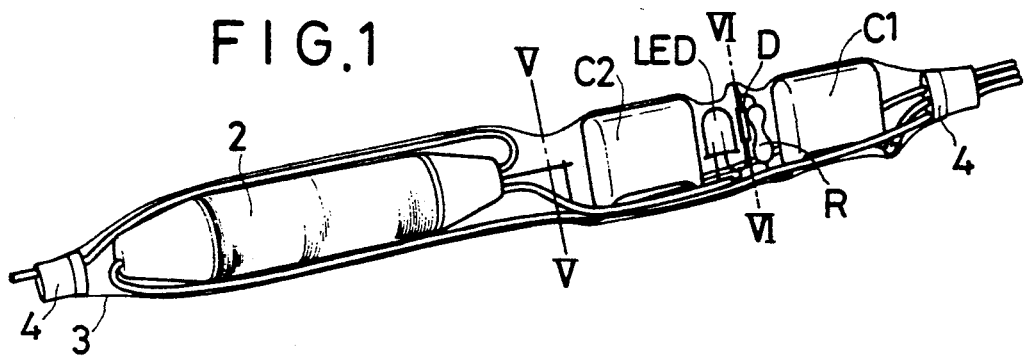
FIG. 1 is a perspective view of an embodiment of an electric circuit unit according to the present invention.
Figure 2:
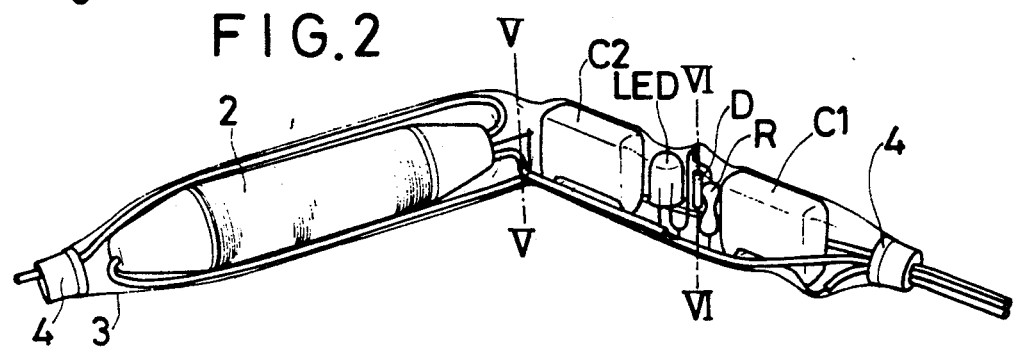
FIG. 2 is a perspective view of the electric circuit unit of FIG. 1 which is bent.
Figure 10:
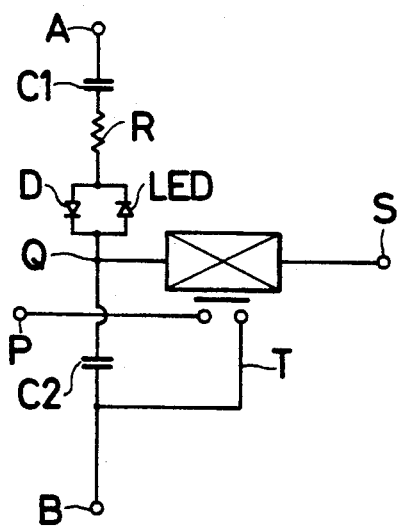
FIG. 10 is a circuit diagram of a modification of a portion enclosed by broken line of FIG. 9.

FIG. 1 is a perspective view of an electric circuit unit according to the present invention corresponding to the electric circuit of FIG. 10. This circuit includes a paralleI connection of a light emitting diode LED and a diode D which is connected in series with a resistor R of the electric circuit unit of FIGS. 5 and 6 described later. Since only lead wires are disposed in an intermediate portion V of a reed relay 2 and a second capacitor C2 of the electric circuit unit, the intermediate portion V can be bent. Moreover since only small electric elements such as a resistor R, the light emitting diode LED and the diode D are disposed in an intermediate portion VI of the second condenser and a first condenser, the intermediate portion VI can be bent similarly. FIG. 2 is a perspective view of the electric circuit unit of FIG. 1 which is bent at the portion V.

Figure 3:
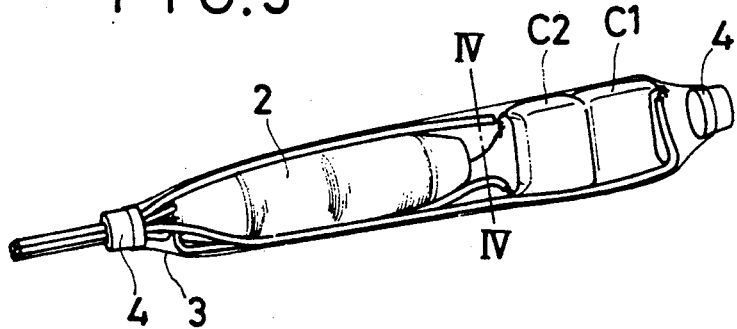
FIG. 3 is a perspective view of another embodiment of an electric circuit unit according to the present invention.
Figure 4:
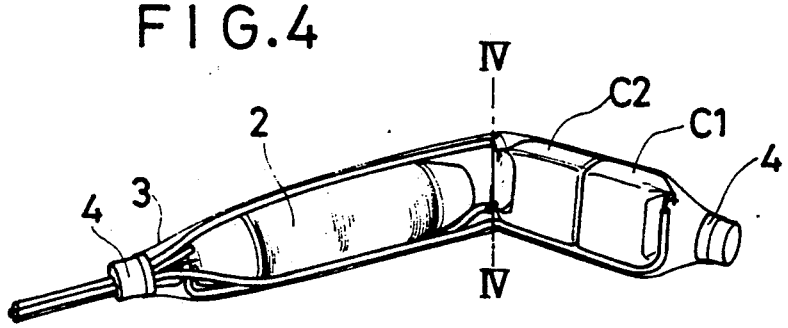
FIG. 4 is a perspective view of the electric circuit unit of FIG. 3 which is bent.
Figure 8:
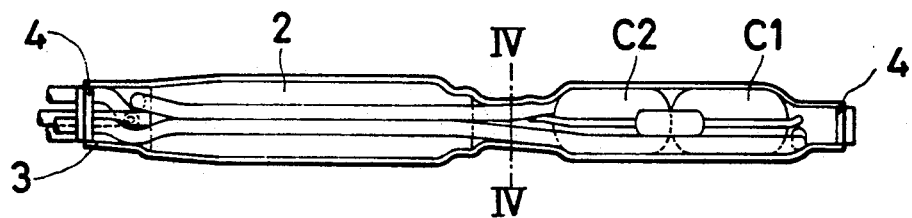
FIG. 8 is a plan view of the electric circuit unit of FIG. 3.

FIG. 3 is a perspective view of an electric circuit unit of FIG. 8, and FIG. 4 is a perspective view of the electric circuit of FIG. 8 which is bent at a portion IV. In this manner, the electric circuit unit can be sent so that the unit can be inserted into an electric appliance easily even if a space in the electric appliance is L-shaped or bent.

Figure 5:
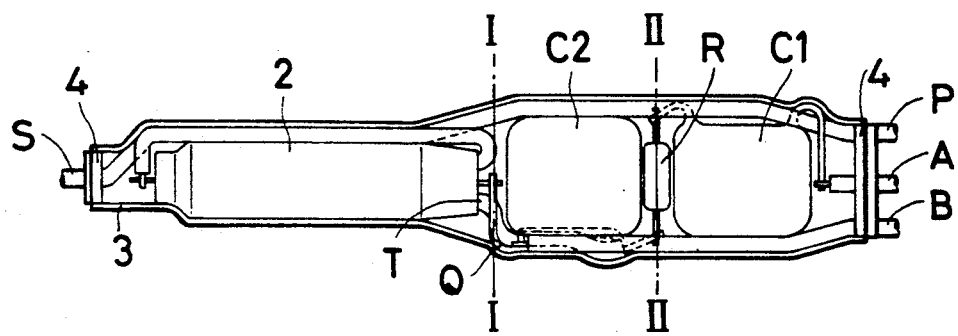
FIG. 5 is a front view of a further embodiment of an electric circuit unit according to the present invention.
Figure 6:
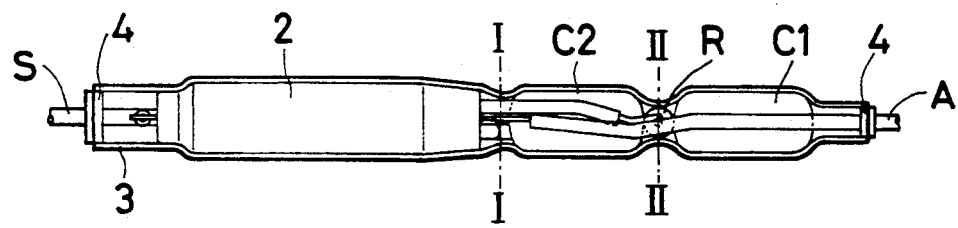
FIG. 6 is a plan view of the electric circuit unit of FIG. 5.
Figure 9:
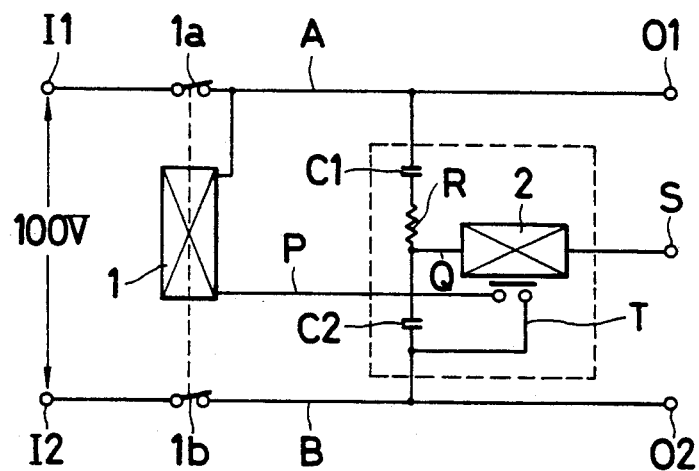
FIG. 9 is a circuit diagram of an example of a water detection type power interrupter circuit.

FIG. 5 is a front view of an electric circuit unit according to the present invention corresponding to the circuit enclosed by broken line of FIG. 9, and FIG. 6 is a plan view of the electric circuit unit of FIG. 5.

The electric circuit unit includes a reed relay 2, first and second capacitors C1 and C2, and a resistor R. A lead wire A is connected to one terminal of the first capacitor C1 and the other terminal of the firs capacitor C1 is connected to one terminal of the resistor R with the other terminal of the resistor R being directly connected to one terminal of the second capacitor C2 which has another terminal to which a lead wire B is connected. A lead wire Q branched from a junction of the second capacitor C2 and the resistor R is connected to one terminal of the reed relay 2 and a lead wire S is connected to the other terminal of the reed relay 2. One terminal of the reed relay 2 is connected through a lead wire T to the second capacitor so that the one terminal of the reed relay 2 is connected to the lead wire B and its other terminal is connected to a lead wire P.

The whole of the electric circuit thus connected is covered by a thermal contractile tube 3, and entrance and exit portions of the lead wires A, B, P and S are sealed by waterproof synthetic resin 4 in a watertight manner.

As apparent from FIGS. 5 and 6, since there is no large electric element in an intermediate portion I of the reed relay 2 and the second capacitor C2, the electric circuit unit can be bent at the intermediate portion I. Further, the electric circuit unit can be also bent at an intermediate portion II of the second capacitor C2 and the first capacitor C1 while the resistor R functions as an axis.

Figure 7:
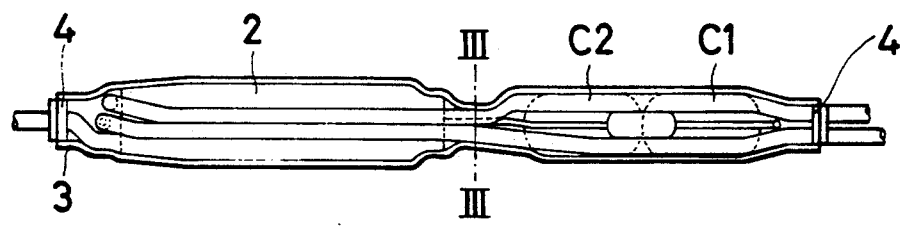
FIG. 7 is a plan view of an electric circuit unit according to the present invention.

FIGS. 7 and 8 are front views of further embodiments of the electric circuit units according to the present invention.

These electric circuit units correspond to the electric circuit in the broken line of FIG. 9.

In the electric circuit unit of FIG. 7, the resistor R disposed between the two capacitors C1 and C2 in FIGS. 5 and 6 is disposed under both of the capacitors C1 and C2. In the electric circuit unit of FIG. 8, the lead wires A, B, P and S in the electric circuit unit of FIG. 7 are disposed to one side.

The electric circuit units in the embodiments of FIGS. 7 and 8 can be bent at intermediate portions III and IV of the reed relay 2 and the second capacitor C2.

Polyolefin, vinyl chloride or polyvinylidene fluoride, for example, can be used as material for the thermal contractile tube for covering the electric circuit unit according to the present invention and is commercially available as a thermal contractile tube.

Waterproof synthetic resin can use commercially available adhesive agent such as polyamide, ethylene vinyl acetate, polypropylene or the like which is melted by heating.

The effects of the present invention are as follows:

i) It is not necessary to provide a printed circuit board corresponding to the shape of the electric appliance.

ii) Since a printed circuit board is not used, the electric circuit unit can be formed to be very compact.

iii) Since the electric circuit unit is deformable, the unit can be easily inserted into a narrow space.

I claim:

1. A method of manufacturing an electric unit including a plurality of electric circuit elements, comprising the steps of:

connecting the the terminals of said electric circuit elements with flexible conductors so that said electric unit can be bent in at least one portion;

covering all of said elements of said electric unit with a deformable and contractile tube;

projecting conductors from a plurality of said elements out of an entrance and exit of said tube for connecting said electric unit and an external electric circuit;

filling the entrance and exit with waterproof synthetic resin made of thermally meltable adhesive agent; and sealing the entrance and exit in a watertight manner by heating said resin.

2. A method of manufacturing an electric unit, comprising:

disposing a reed relay, first and second capacitors and a resistor in a substantially straight direction;

forming a first circuit by directly connecting one terminal of the first capacitor to one terminal of the resistor, the other terminal of the resistor to one terminal of the second capacitor and through a flexible lead wire to one terminal of the reed relay, directly connecting the other terminal of the second capacitor to one contact of the reed relay, the one terminal of the first capacitor, the other terminal of the second capacitor, the other terminal of the reed relay, and connecting the other contact of the reed relay to a flexible lead wire for connection to an external circuit;

covering the whole of said first electric circuit with a deformable and contractile tube;

passing the lead wire and conductors from said first circuit through an entrance and an exit of said tube;

filling the entrance and exit with waterproof synthetic resin made of thermally meltable adhesive agent; and sealing the entrance and exit in watertight manner by heating said resin.

3. A method of manufacturing an electric unit, comprising:

disposing a reed delay, first and second capacitor, a resistor, a light emitting diode and a diode in substantially straight directions;

forming a first circuit by directly connecting one terminal of the first capacitor to one terminal of the resistor, directly connecting the other terminal of the resistor to one terminal of a reverse parallel circuit of the light emitting diode and the diode, connecting the other terminal of the reverse parallel circuit to one terminal of the second capacitor directly and through a flexible lead wire to one terminal of the reed delay, directly connecting the other terminal of the second capacitor to one contact of the reed relay, connecting the one terminal of the first capacitor, the other terminal of the second capacitor, the other terminal of the reed relay and the other contact of the reed relay to a flexible lead wire for connection to an external circuit;

covering the whole of said first electric circuit with a deformable and contractile tube;

passing the lead wire and conductors from said first circuit through an entrance and exit of the tube;

filling the entrance and exit with waterproof synthetic resin made of thermally meltable adhesive agent; and sealing the entrance and exit in watertight manner by heating said resin.

* * * * *